United States Patent [19]

Jarrett et al.

[11] 4,348,600
[45] Sep. 7, 1982

[54] CONTROLLED CURRENT SOURCE FOR I²L TO ANALOG INTERFACES

[75] Inventors: Robert B. Jarrett; Wilson D. Pace, both of Tempe, Ariz.

[73] Assignee: Motorola, Inc., Schaumburg, Ill.

[21] Appl. No.: 132,704

[22] Filed: Mar. 21, 1980

Related U.S. Application Data

[63] Continuation of Ser. No. 877,626, Feb. 14, 1978, abandoned.

[51] Int. Cl.³ .................. H03K 19/081; H01L 27/04
[52] U.S. Cl. ............................... 307/475; 307/296 R; 307/477; 357/35; 357/92
[58] Field of Search ................. 357/92, 44, 46, 35; 307/477, 317 A, 459, 475, 296 R

[56] References Cited

U.S. PATENT DOCUMENTS

| | | | |
|---|---|---|---|
| 3,879,745 | 4/1975 | Tharmaratnam | 357/46 |
| 3,947,865 | 3/1976 | Russell | 357/46 |
| 3,987,310 | 10/1976 | Peltier | 307/317 A |
| 4,007,385 | 2/1977 | Chapron | 357/92 |
| 4,009,397 | 2/1977 | Mulder | 357/44 |
| 4,035,664 | 7/1977 | Berger et al. | 357/92 |
| 4,056,810 | 11/1977 | Hart et al. | 357/92 |
| 4,158,146 | 6/1979 | Smeulers et al. | 357/92 |
| 4,286,177 | 8/1981 | Hart et al. | 357/92 |

OTHER PUBLICATIONS

Hibberd, Integrated Circuits, (McGraw-Hill, N.Y., copyright Tex. Insts., 1969), pp. 36-37.

Detroye, IEEE J. of Solid State Circuits, vol. SC9, No. 5, Oct. 1974, pp. 209-210.
Mulder et al., IEEE J. of Solid State Circuits, vol. SC-11, No. 3, Jun. 1976, pp. 379-381.
Hamilton et al., Basic IC Engineering, (McGraw-Hill, N.Y., 1975), p. 487.

Primary Examiner—William D. Larkins
Attorney, Agent, or Firm—Michael D. Bingham

[57] ABSTRACT

Structure fabricating using standard integrated injection logic (I²L) process techniques for providing a multiple of controlled current source outputs for driving I²L to analog interfaces. The current source structure is formed in minimum die area because of the space saving features of I²L and tracks the performance of the I²L circuit. The current source includes a common P-type emitter region diffused into an isolated N-type epitaxial layer which has been isolated by a deep N+-type diffusion region. Multiple collector P-type regions which are isolated from each other by the N+-type isolating region are diffused into the isolated portion of the epitaxial layer in spaced relationship to the common emitter region. An ion implanted resistor couples the common emitter region to a source of operating potential such that current is injected from the emitter region via the lateral PNP formed transistors to produce multiple output currents from the collector regions. The collector regions are connected using conductive interconnects to respective I²L to analog interfaces to provide current for operation of both the open collector I²L gates and the analog devices.

6 Claims, 4 Drawing Figures

CONTROLLED CURRENT SOURCE FOR I²L TO ANALOG INTERFACES

This is a continuation of application Ser. No. 877,626, filed Feb. 14, 1978, now abandoned.

BACKGROUND OF THE INVENTION

This invention relates to a current source circuit and more particularly to a circuit to be utilized in a monolithic circuit having I²L to analog interfacing circuits which provides a controlled source of current to interface between the open collector gates of the I²L circuit portion and the pull up current for the analog circuitry.

The discovery of the compatibility of I²L techniques to linear integrated circuit techniques has added new dimensions for integration of entire linear/digital systems on a single monolithic chip. When analog and digital functions are integrated, a new degree of simplicity is achieved with corresponding cost advantages. Such systems may require many interfaces between I²L gates and typical non-inverted linear NPN transistors. In order to interface the open collector logic gates to the base electrodes of a linear transistor it is necessary to provide a current from some source. This current may be utilized to both: source the open collectors of the I²L gates; and to provide the base pull up current for the linear non-inverted devices.

Conventional techniques for interfacing between the aforementioned open collector I²L gates and linear devices are just not practical for realization in large scale integrated systems. For example, a standard technique may be to utilize a multi-collector lateral PNP transistor device. The emitter electrode of the transistor is usually coupled via a resistor to a source of supply with the collector electrodes being coupled respectively to a particular I²L gate to analog interface. This method of providing the current source to the I²L to analog interface suffers from a serious drawback when large scale linear-digital systems are to be incorporated on a single chip. Because of the low power consumption and minimum chip area available the fan out capabilities of the aforedescribed multi-collector lateral device is severely limited such that only a few I²L to analog interfaces can be supplied thereby. Thus, for large digital/analog systems, many such interfaces would require a corresponding number of multi-collector transistor circuits. Thus the conventional current interface technique would consume a disproportionate share of available die area; defeating the goal of designing large scale linear/digital circuits on a single monolithic chip. Therefore, a need exists for an interface circuit having multiple fan out capabilities in a minimum die area.

In addition, current sources fabricated with standard lateral PNP transistors will not compensate for injector alpha variations in the I²L circuitry. Injection alpha is defined as the efficiency of the injector bar to source current to the inverted transistors forming the I²L gates. Due to conventional I²L processes the injection current can vary widely from wafer to wafer. Therefore, it is possible that the current generated by conventional interface circuits can exceed the sinking capability of the I²L gates thereby causing the digital/analog system to become nonoperable. Thus, a need exists to provide an interface circuit for providing a control current source which tracks I²L circuit performance characteristics.

SUMMARY OF THE INVENTION

Accordingly, it is an object of the present invention to provide a circuit to generate a controlled current source to I²L to analog circuit interfaces.

It is another object of the invention to provide a current interface circuit suitable for use with an I²L circuit which tracks the circuit performances thereof.

A still further object of the invention is to provide a monolithic integrated current interface circuit in minimal die area having multiple fan out capabilities.

An additional object of the invention is to provide a monolithic structure for generating a controlled current source for driving both I²L gates and analog output devices.

A further object is to provide a current interface circuit suitable for being fabricated in monolithic circuits and having both minimal die area and matched performances to I²L gates to which the circuit provides a source of current.

The above and other objects are met in accordance with the present invention wherein the interface circuit is fabricated in monolithic form including a semiconductor substrate of a first conductivity type and a buried layer of a second conductivity type located in the substrate. An epitaxial layer of second conductivity type is grown on the substrate having an outward facing surface which covers the buried layer and extends into the substrate. A deep isolating diffusion is utilized which extends from the surface of the epitaxial layer into the buried layer to isolate a portion of the epitaxial layer from the remainder thereof. The isolation diffusion is of the second conductivity type and of generally greater concentration than the buried layer. A common emitter injector region is diffused into the isolated portion of the epitaxial layer which is of the first conductivity type. Concurrently with the emitter diffusion, at least one collector region is diffused into said isolated portion of the epitaxial layer in spaced relationship to the emitter region. In the preferred embodiment of the invention, multi-collector regions are formed in spaced relationship to the emitter region such that multiple lateral transistors are produced each sharing a common emitter. The common emitter region is coupled to a source of operation potential via an ion implanted resistor such that multiple control current sources are generated by the structure.

It should be noted that the aforedescribed structure is realized using general I²L processing techniques such that the current interface circuit performance matches the variations in I²L current to which it may be coupled. As can be seen, the use of I²L technique provides a multiple current fan out circuit compatible to I²L-/analog interfaces which requires a minimum die area in comparison with conventional current sources utilizing lateral transistor techniques.

DETAILED DESCRIPTION OF THE INVENTION

Figure 1:
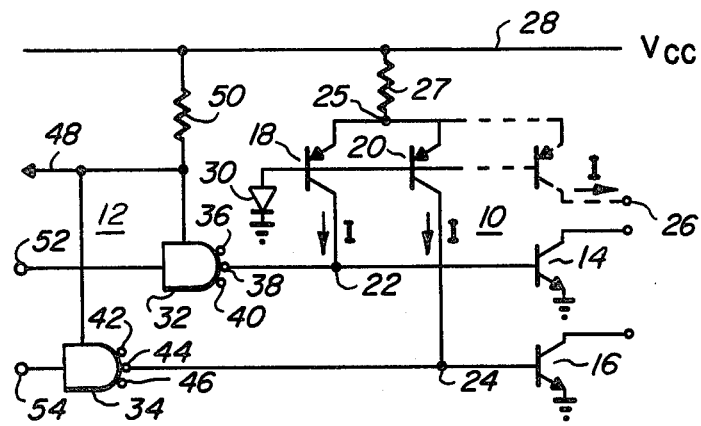
FIG. 1 shows in schematic diagram form the current interface circuit of the present invention.
Figure 3:
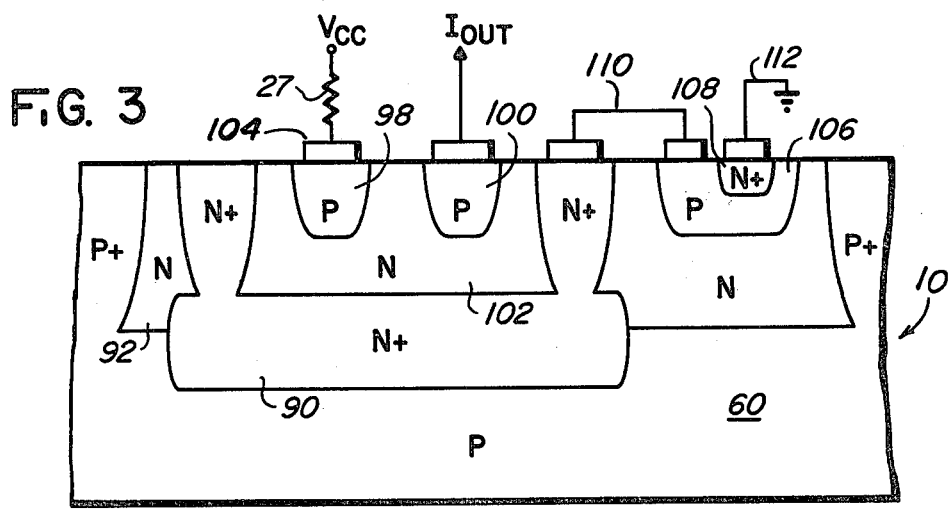
FIG. 3 shows an enlarged cross-sectional view of the interface circuit of the invention taken in the direction of arrows 3—3.

Turning to FIGS. 1 and 3 there is shown current source interfacing circuit 10 of the present invention. Circuit 10 is illustrated in a functional schemtic diagram form in FIG. 1 and structurally by the cross-sectional view of FIG. 3. Current interfacing circuit 10 provides multiple output controlled currents (I) between open collector gates of integrated injection logic (I²L) circuit 12 and, for example, analog devices 14 and 16 which require pull up current for operation. Schematically, current interfacing circuit 10 is illustrated as comprising a plurality of PNP transistors 18, 20 . . . N which may be formed laterally in the monolithic circuit as seen in FIG. 3. By matching the PNP transistors, the current supplied at the respective collector electrodes to nodes 22, 24 and 26 can be made to be of equal magnitude; determined by the size of resistor 26 which couples the emitters of the transistors to potential source $V_{CC}$ via power supply conductor 28. As will be discussed in full detail later, in actual fabrication a common emitter region is utilized for transistors 18, 20 . . . N which injects current to the collectors thereof. The base electrodes of these transistors are commonly coupled to diode 30 which biases these transistors one diode voltage drop above reference potential (which as shown may be ground potential). Transistors 18. 20 . . . N are biased by diode 30 such that they will not become saturated during circuit operation.

I²L circuit 12 is illustrated as comprising NAND gates 32 and 34 each having a plurality of open collector outputs indicated by reference numerals 36-40 and 42-46 respectively. Additional NAND gates may be driven from node 48 by a common injector bar as is understood. The common injector bar (see FIG. 2) is coupled to power supply conductor 28 via resistor 50. Generally, I²L circuit 12 is known, for instance see the article "Bipolar LSI Takes a New Direction With Integrated Injection Logic," Electronics, Oct. 3, 1974, pp. 111-118. As shown, outputs 38 and 44 of NAND gates 32 and 34 are coupled to the base electrodes of noninverted NPN transistors 14 and 16 respectively via nodes 22 and 24 which form the I²L to analog interface of a linear/digital system.

In operation, input signals applied to inputs 52 and 54 of gates 32 and 34 cause switching of states at the outputs thereof. When, for example, NAND gate 32 is rendered active, the current I is sourced via node 22 to the particular open collector gate 38. In this state base pull up current is stolen from transistor 14 thereby rendering it nonconductive. In the opposite state, when NAND gate 32 is rendered inactive by the signal appearing at node 52, the current I provides the base pull up current to transistor 14 rendering it conductive to sink current at its collector electrode. The interface between I²L gate 34 and transistor 16 operates in the exact manner discussed above. Hence, as it seen, current interfacing circuit 10 provides a controlled source of current between open collector I²L gates of circuit 12 and pull up current to transistors 14 and 16 for operation of the linear/digital system.

Figure 2:
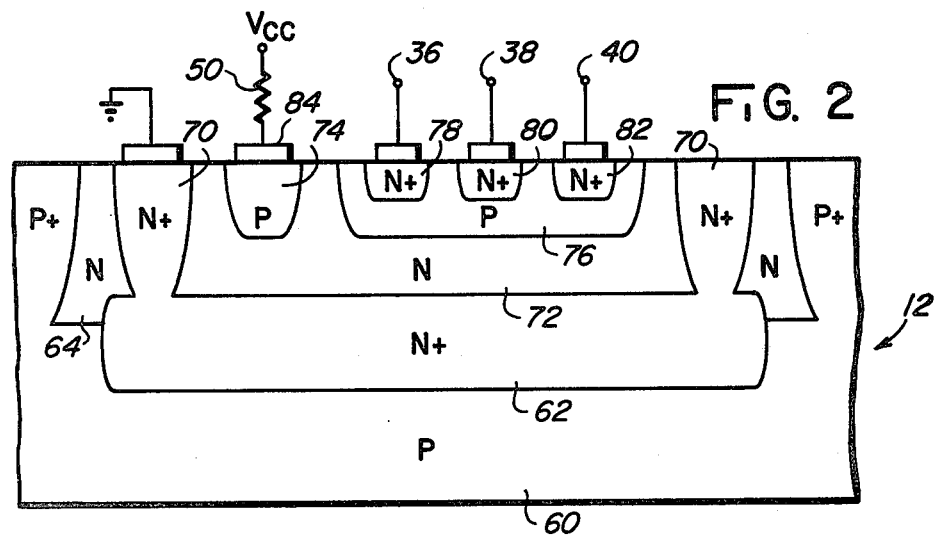
FIG. 2 shows an enlarged cross-sectional view of typical I²L gates shown in FIG. 1 taken in the direction of arrows 2—2.

Turning to FIG. 2 there is shown an enlarged cross-sectional view of I²L circuit 12. Enlarged substrate portion 60, which may be a P-type silicon, may be the substrate for the single chip linear/digital system on which the I²L circuit 12 is formed. Buried layer 62 of N-type material having a given concentration is formed into substrate 60 using known techniques. Next, epitaxial layer 64 is grown, as is known, onto substrate 60 and buried layer 62. The epitaxial layer may be of the same conductivity type i.e., N, as the buried layer but of lesser concentration of donor impurities in the buried layer. Immediately after buried layer 62 was initially formed its top surface 66 was in the same plane as surface 68 of the substrate. However, during subsequent processing steps surface 66 of the buried layer tends to out diffuse onto epitaxial layer 64 to provide the raised configuration shown in FIG. 2. Deep P+ diffusion regions may then be formed in the substrate to isolate the I²L circuit from other circuit portions comprising the system.

Next, using known photolithic graphic and etch processes, a deep isolation diffusion is made as shown by diffusion regions 70 which isolate a portion of the epitaxial layer 64 from itself. The conductivity type of the isolating diffusion region is the same as that for the buried layer but of higher concentration. Next P-type diffused regions are formed into isolated epitaxial layer porton 72. P-type region 74 becomes the injector bar for the I²L circuit. The open collector regions of the I²L circuit are then diffused into P-type tub 76 which are in spaced relationship to the injector bar. These open collector regions are generally noted by reference numerals 78, 80 and 82. For simplicity, known processing techniques for providing interconnection patterns between components of the monolithic circuit using conductive material and photoresist techniques are not shown. However, injector bias resistor 50 which is shown schematically may be an ion implanted resistor formed in substrate 60 and is coupled to the injector bar 74 through metallization area 84. Similarly, the multicollector regions 78, 80 and 82 are coupled to the output of the I²L circuit by conductive metallization layers. As shown, the collector regions 78, 80 and 82 may be coupled to terminals 36, 38 and 40 comprising the output of NAND gate 32.

Figure 4:
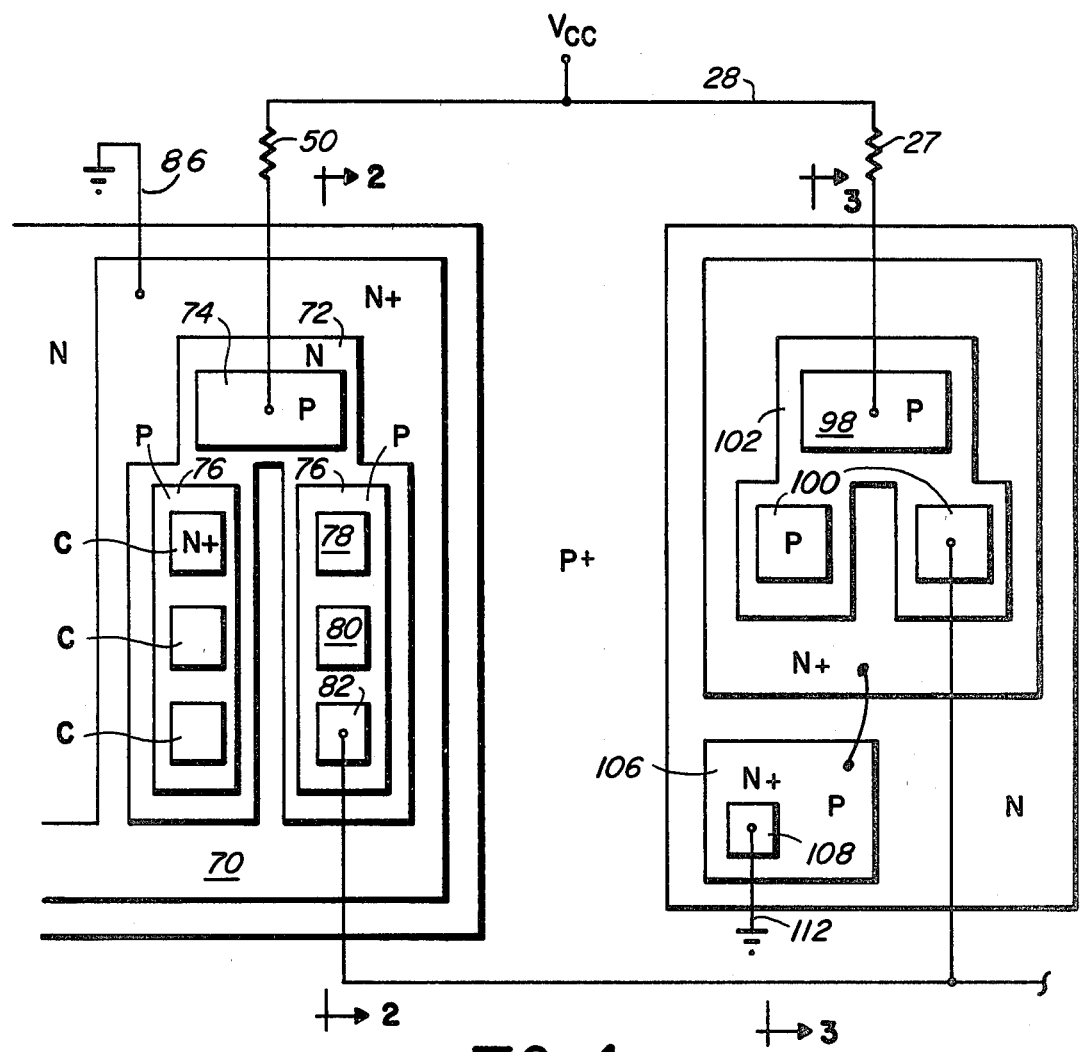
FIG. 4 shows a top view indicating the shapes and outlines of the different semiconductor regions forming the I²L gates and interface circuits of FIGS. 2 and 3.

As shown in FIG. 4 isolating region 70 outlines and surrounds the I²L gates isolating the multiple collector regions 78, 80 and 82 from other collector regions generally shown by reference numeral C which may share common injector bar 74. Heavily doped isolated region 70 kills the parasitic effects of the PNP transistors between two adjacent gates as is known. As seen, multiple open collector inverter transistor gates are formed by the above described process. The base of the lateral PNP injector transistor formed is connected to ground potential through metallization 86.

Turning to FIG. 3, the structure of current interfacing circuit 10 is described. As is seen current interfacing circuit 10 is fabricated using the I²L process techniques aforedescribed for the I²L circuit 12. Particularly, buried layer 90 is formed in substrate 60 at the same time that buried layer 62 is formed for I²L circuit 12. Concurrent with the fabrication of epitaxial layer 64, epitaxial layer 92 is grown over substrate 60 and buried layer 90. After the N-type epitaxial layer 92 has been grown a deep R+ diffusion may be performed to isolate the conventional components comprising the system in the monolithic circuit as aforementioned. Similarly to the above, a deep N-type isolation region is formed which extends from the surface of epitaxial layer 92 into buried layer 90 to isolate a portion of the epitaxial layer from the remainder thereof. Then P-type diffusion regions 98 and 100 are formed in the isolated epitaxial region 102 in spaced relationship to one another. P diffusion region 98 forms a common emitter injection region for the lateral PNP transistor device, for example, transistor 18 in FIG. 1. The common emitter region 98 is coupled to ion implanted resistor 26 by metallization layer 104. As shown, diode 30 is formed in epitaxial layer 92 exterior to the isolated epitaxial region and comprises P-type diffusion region 106 and N-type diffused region 108. The anode of diode 30 is commonly coupled to the base region of the lateral PNP transistors formed by the structure through metallization layer 110. The cathode of diode 30 may then be coupled to ground reference potential via metallization layer 112.

As shown in FIG. 4, common emitter region 98 provides the common emitter for the lateral PNP transistors formed by region 98, layer epitaxial isolated region 102 and multicollector regions 100. Again the deep N type isolating diffusion region isolates the multiple collector regions of the lateral PNP transistors from each other. As is realized, the current interface circuit 10 is formed utilizing the space saving features of I²L. Thus multiple controlled current sources can be provided from such a structure to interface between the I²L and analog output devices in a minimum die area on the chip.

By using standard I²L processing techniques, the current interfacing circuit 10 will track the performances of the I²L circuit 12 formed concurrently therewith. Hence, the current sourced from circuit 10 is sufficient for sourcing the open collector I²L gates without becoming greater than the capabilities of these devices to sink this current. This provides a significant improvement over conventional techniques for providing the interfacing current.

In addition to the above, the current interfacing circuit 10 enjoys good noise immunity with respect to any noise induced on the power supply potential $V_{CC}$. For example, if $V_{CC}$ equals 10 volts upon which 2 volts of high frequency noise is introduced thereon, magnitude of voltage at terminal 25 will never go below 8 volts. Thus, because the emitters of transistors 18, 20 . . . N are biased up at 2$\phi$ (two base-to-emitter voltage drops) these transistors cannot be rendered nonconductive by the noise. Therefore, the currents I never go to zero but continue to flow even though they may be slightly reduced.

What is claimed is:

1. A monolithic circuit comprising:
   logic gate means including a first and second transistor of complementary conductivity type, said first transistor having an emitter region, a base region, and at least one collector region, said emitter region being coupled to a source of reference potential, said base region being coupled to an input of said logic gate means, said collector region being an output of said logic gate means, said second transistor having an emitter region, a base region and a collector region, said emitter region being coupled to a source of operating potential, said base region being formed in common with said emitter region of said first transistor, said collector region being formed in common with said base region of said first transistor;
   output circuit means including a third transistor of like conductivity type as said first transistor having an emitter region, a base region and a collector region, said base region being coupled at a circuit node to said collector region of said first transistor, said emitter region being coupled to said source of reference potential and said collector region being coupled to an output circuit node; and
   current source means for sourcing current to said circuit node including a fourth transistor of like conductivity type as said second transistor having a common emitter region, a base region and at least one collector region, said common emitter region being coupled to said source of operating potential, said base region receiving a bias potential thereat wherein said bias potential is different from said reference potential, said at least one collector region being coupled to said circuit node.

2. The monolithic circuit of claim 1 including diode means coupled between said reference potential and said base region of said fourth transistor such that said base region of said fourth transistor is maintained at a different potential value than said base region of said second transistor.

3. In a monolithic integrated circuit including an integrated injection logic (I²L) gate circuit in combination with an output transistor, the I²L gate circuit having at least one output and a first transistor having base, emitter and collector regions, the base region being coupled to a reference potential, the emitter region being coupled to a source of operating potential, and a collector region being coupled to an input of the logic gate circuit, a second transistor having an emitter, base and at least one collector region, the emitter region being coupled to the reference potential, the base region being formed in common with the collector region of the first transistor, the collector region being coupled to the at least one output of the I²L gate circuit, the output transistor having an emitter region, base region and collector region, the base region being coupled at a first circuit node to the at least one output of the logic gate, the emitter region being coupled to the reference potential and the collector being coupled to an output circuit node an interface circuit for sourcing current to the first circuit node comprising:
   controlled current sourcing means including a third transistor of like conductivity type and structure as the first transistor having an emitter region, a base region and at least one collector region, said emitter region being coupled to the source of operating potential, said at least one collector region being coupled to the first circuit node; and
   bias means for biasing said base region of said third transistor at a first bias potential that is different from the reference potential.

4. The monolithic circuit of claim 3 wherein said bias means includes a diode coupled between said base region of said third transistor and the reference potential.

5. A monolithic integrated circuit comprising at least one logic gate including an NPN transistor formed therein having an emitter region, a base region and multiple collector regions, the emitter region being coupled to a first bias potential, the multiple collector regions being outputs of the logic gate; a first PNP current sourcing transistor formed in the integrated circuit having an emitter region, base region and collector region, the collector region being formed in common with the base region of the NPN transistor, the emitter region being coupled to a source of operating potential, the base region being formed in common with the emitter region of the NPN transistor; the base region of the first PNP transistor being coupled to the first bias potential; an NPN transistor formed in the integrated circuit having an emitter region, a base region and collector region, the emitter region being coupled to the first bias potential, the collector region being an output of the integrated circuit, the base region being coupled to a particular one of the multiple collector regions of the NPN transistor of said at least one logic gate, a second PNP current sourcing transistor formed in the integrated circuit having an emitter region, a base region and at least one collector region, the emitter region being coupled to the source of operating potential, said at least one collector region being coupled to said particular one of the multiple collector regions of the NPN transistor of said at least one logic gate, and biasing means coupled between said base region of said second PNP transistor and the first bias potential for biasing said base region of said second PNP transistor to a second bias potential different than said first bias potential.

6. The circuit of claim 5 wherein the bias means includes a diode formed in the circuit having an anode and cathode, the anode being coupled to the base region of the second PNP transistor, the cathode being coupled to the first bias potential.

* * * * *